US006140572A

United States Patent [19]
Book

[11] Patent Number: 6,140,572
[45] Date of Patent: Oct. 31, 2000

[54] TRANSFORMER TANK WITH DETACHABLE CABINET INTERFACE

[75] Inventor: William James Book, Jefferson City, Mo.

[73] Assignee: ABB Power T&D Company Inc., Raleigh, N.C.

[21] Appl. No.: 09/318,974

[22] Filed: May 26, 1999

[51] Int. Cl.[7] .................................................. H05K 5/00

[52] U.S. Cl. ..................... 174/17 CT; 174/50; 174/52.2; 220/4.24; 220/683; 52/582.1; 403/292; 336/65

[58] Field of Search ....................... 174/50, 52.2, 17 CT, 174/37; 220/683, 684, 685, 4.24; 52/582.1; 403/292, 406.1; 336/65

[56] References Cited

U.S. PATENT DOCUMENTS

| | | | |
|---|---|---|---|
| 3,784,727 | 1/1974 | Haubein | 174/52.1 |
| 3,801,727 | 4/1974 | Wilkinson et al. | 174/50 |
| 3,841,032 | 10/1974 | Grannis | 336/65 |
| 4,533,786 | 8/1985 | Borgmeyer et al. | 174/50 |
| 4,533,788 | 8/1985 | Borgmeyer et al. | 174/88 C |
| 5,189,257 | 2/1993 | Borgmeyer et al. | 174/50 |
| 5,573,319 | 11/1996 | Dirk | 312/100 |
| 5,739,464 | 4/1998 | Adkins et al. | 174/50 |

FOREIGN PATENT DOCUMENTS

| | | | |
|---|---|---|---|
| 1141172 | 1/1969 | United Kingdom | 220/683 |

*Primary Examiner*—Kristine Kincaid
*Assistant Examiner*—Dhiru R Patel
*Attorney, Agent, or Firm*—Woodcock Washburn Kurtz Mackiewicz & Norris LLP

[57] ABSTRACT

A transformer tank with detachable cabinet interface. The transformer tank has a metal front panel for attachment of an electrical cable. A one-piece enclosure of non-conductive, flame resistant material cooperates with the front panel to provide an enclosed cable compartment for the transformer tank. A cabinet interface of non-conductive, flame resistant material is mounted on the periphery of the front panel. The interface is comprised of strip material having a tongue and groove or Y-shape.

5 Claims, 2 Drawing Sheets

TRANSFORMER TANK WITH DETACHABLE CABINET INTERFACE

BACKGROUND OF THE INVENTION

1. Field of the Invention

This invention relates in general to electrical transformer enclosures and more specifically to a transformer tank with detachable cabinet interface.

2. Description of the Prior Art

Single phase padmounted transformers are installed in residential areas, and it is desirable that they be aesthetically designed and have no sharp comers or edges as well as having tamper-resistant interfaces between the cable component cover and the transformer tank. An example of such padmounted transformer enclosures is disclosed in U.S. Pat. No. 4,533,786. In that patent there is disclosed a metal "clam shell" type cover with a large steel cover hinged at the top and a sill approximately 6" high to which the cover is bolted. A variety of baffling was built into the cover and/or sill to meet the ANSI C.57.12–28 tamper resistance requirements. One of the problems with metal transformer covers or enclosures is that they are subject to significant corrosion problems. Such problems are encountered in coastal environment and even in non-coastal regions corrosion problems can be experienced due to fertilizers, road salt, irrigation systems, lawn equipment, etc. While stainless steel cabinets will solve the corrosion problem, such cabinets are expensive.

In U.S. Pat. No. 5,739,464 there is disclosed a cable compartment enclosure that is non-metallic, non-conductive and thus not subject to corrosion problems. In that patent the enclosure is of one-piece construction and does not require a cover hinge at the top and a sill. In that patent the composite hood design utilizes a simple, metal "knife-edge" interface on the transformer tank (male portion) and a grooved interface on the composite hood (female portion). While the composite hood design provided corrosion resistance for the hood, one deficiency of the design was the metal "knife-edge" of the tank that is susceptible to damage, either by handling (bent edges) or by installing and removing the hood (rubs paint off which starts corrosion). It would be desirable to provide a design to eliminate the metal "knife-edge" problem and add a small "adaptor" to the knife-edge of the tank to create a "knife-edge" of dent-resistance, corrosion-resistant material. It also would be desirable to be able to upgrade existing transformers to include a non-conductive enclosure.

SUMMARY OF THE INVENTION

The present invention is directed to a transformer tank with detachable cabinet interface wherein the transformer tank has a metal front panel for attachment of an electrical cable, a pair of metal sidewalls connected to the opposite ends of the front panel and a metal top panel connected to the upper edge of the front panel and interconnecting the pair of sidewalls. An enclosure of non-conductive flame resistant material is provided for cooperation with the front panel to provide an enclosed cable compartment for the tank. A cabinet interface of non-conductive, flame resistant material is mounted on the periphery of the front panel, the interface being constructed and arranged to mate with the enclosure to provide a seal between the front panel of the tank and the enclosure for the cable compartment. In one form of the invention, the interface comprises a strip material having a tongue and groove cross-section, with the groove section engaging the periphery of the front panel and the tongue mating with the periphery of the enclosure. In another form of the invention the interface comprises strip material having a Y-shaped cross-section, with the upper portion of the Y engaging the periphery of the front panel and the lower portion of the Y mating with the periphery of the enclosure. The interface material is secured to the periphery of the front panel.

In another aspect of the invention there is provided in a transformer having a transformer tank with a metal front panel for attachment of an electrical cable, a pair of metal sidewalls connected to the opposite ends of a front panel and a metal top panel connected to the upper edges of the front panel and interconnecting the pair of sidewalls, an enclosure of non-conductive, flame resistant material for cooperation with the front panel to provide an enclosed cable compartment for the tank, the improvement of a cabinet interface of non-conductive, flame resistant material having a bifurcated edge for mounting the interface on the periphery of the front panel and a non-bifurcated edge arranged to mate with the periphery of the enclosure to provide a seal between the front panel of the tank and the enclosure for the cable compartment.

BRIEF DESCRIPTION OF THE DRAWINGS

For a more detailed disclosure of the invention and for further objects and advantages thereof, reference is to be had to the following description taken in conjunction with the accompanying drawings, in which.

DESCRIPTION OF THE PREFERRED EMBODIMENT

Figure 1:
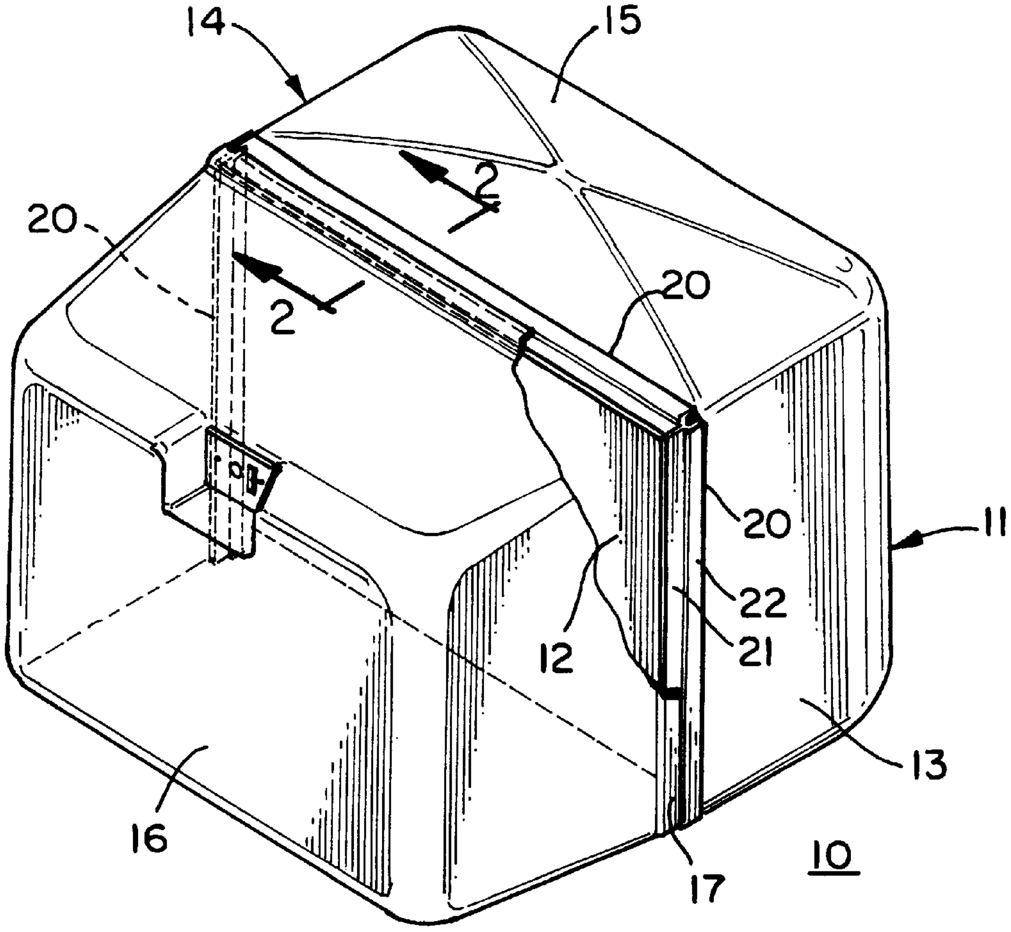
FIG. 1 is a perspective view of the present invention showing a transformer tank with an enclosure of non-conductive, flame resistant material and a cabinet interface of non-conductive flame resistant material mounted on the periphery of the front panel of the transformer tank for cooperation with the enclosure.
Figure 2:
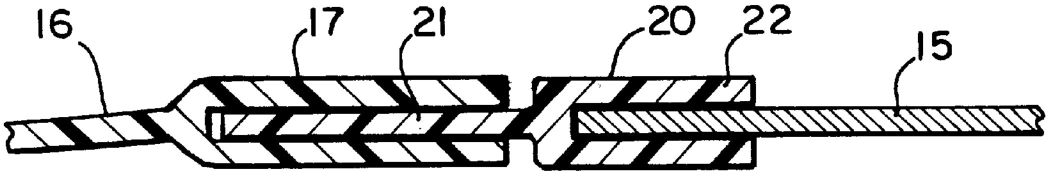
FIG. 2 is a sectional view on enlarged scale taken along the lines 2—2 in FIG. 1.

Referring to FIG. 1 it is illustrated a padmounted transformer 10 having an improved cabinet interface of non-conductive flame resistant material mounted on the periphery of the front panel in accordance with the present invention. The transformer 10 may be generally of the type disclosed in the aforesaid U.S. Pat. No. 5,739,464, the disclosure therein being incorporated herein by this reference thereto. It includes a transformer tank 11 having a front panel 12 for the attachment of electrical cable, not shown. The transformer tank 11 includes a pair of metal sidewalls 13, 14 connected to the opposite ends of the front panel 12 and a metal top panel 15 connected to the upper edge of the front panel 12 and interconnecting the pair of sidewalls 13, 14. Each of the sidewalls 13 and 14 and the top panel 15 has an edge or tongue structure that extends outwardly from the front panel 12. This may be seen in FIG. 2 which shows a sectional view with respect to the top panel 15.

As may be seen in FIG. 1, an enclosure 16 of non-conductive flame resistant material cooperates with the front panel 12 to provide an enclosed cable compartment for the tank 11. The enclosure 16 preferably is molded in one-piece construction from a non-conductive, flame resistant composite material including a thermoset resin impregnated with glass fibers. Other suitable non-conductive composite materials having similar physical characteristics including light weight and high strength may also be used. The periphery of the enclosure 16 is provided with a groove 17 for normally receiving the tongue structure on the periphery of the tank panel 12.

In accordance with the present invention, a cabinet interface 20 of non-conductive, flame resistant composite material is mounted on the periphery of the front panel 12. The interface 20 is formed from strip material having a bifurcated edge for mounting the interface on the periphery of the front panel 12 and a non-bifurcated edge arranged to meet with the periphery of the enclosure 16 to provide a seal between the front panel 12 of the tank 11 and the enclosure 16 for the cable compartment. The interface 20 preferably comprises composite strip material having a tongue 21 and groove 22, with the groove section 22 engaging knife edges around the periphery of the front panel 12 and the tongue mating with the groove 17 in the periphery of the enclosure 16. It is preferable that the non-conductive interface 20 be made in sections, for example by extrusion, with each section being secured to the respective knife edges surrounding the front panel 12 of the tank 11 as by adhesive.

Figure 3:
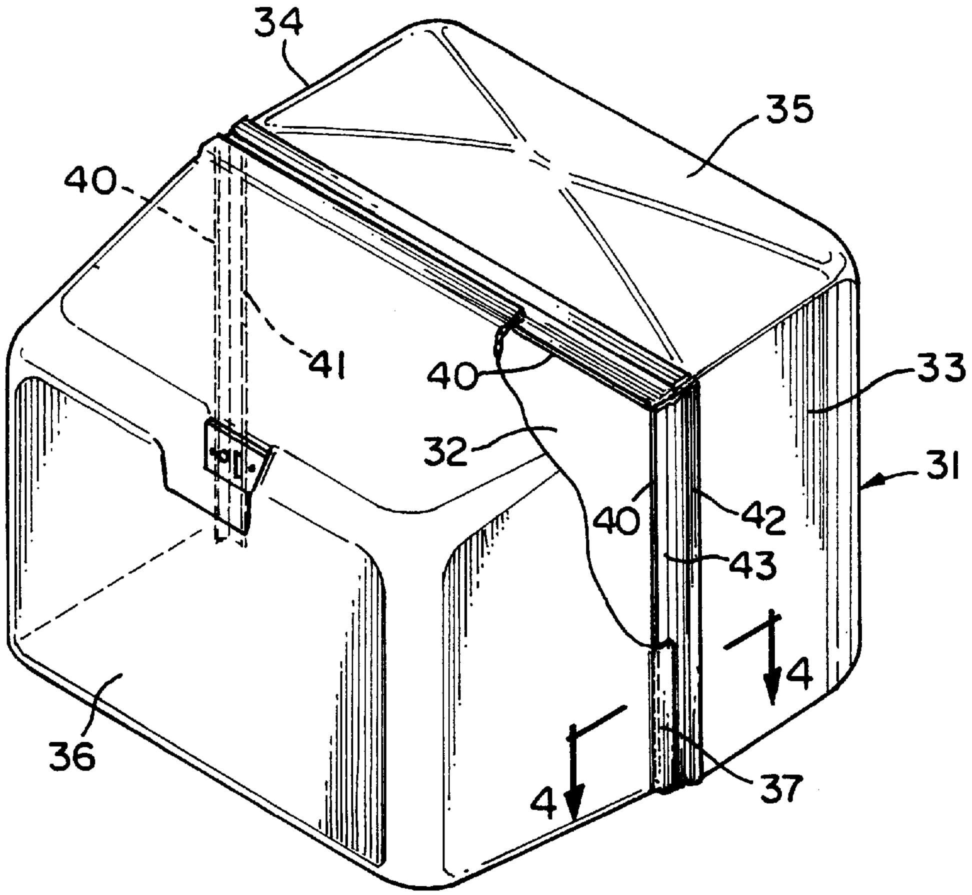
FIG. 3 is a perspective view of a modification of the present invention showing a transformer tank and an enclosure of non-conductive, flame resistant material and a cabinet interface of non-conductive flame resistant material mounted on the periphery of the front panel for cooperation with the enclosure.
Figure 4:
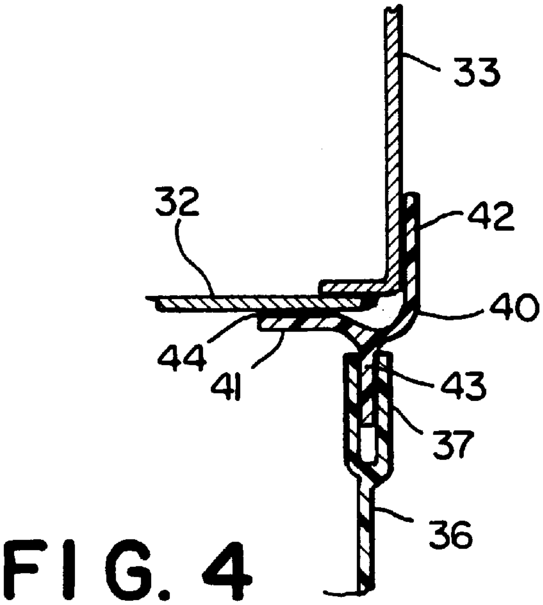
FIG. 4 is a sectional view taken along the lines 4—4 in FIG. 3 showing the interface material in cooperation with the cabinet enclosure.

Referring to FIGS. 3 and 4 there is illustrated a modification of the present invention. This modification enables existing transformers to be upgraded to include a non-conductive enclosure of this type illustrated in the aforesaid U.S. Pat. No. 5,739,464. Such prior transformers normally do not include a knife edge extending around the periphery of the front panel as disclosed in U.S. Pat. No. 5,739,464. In this modification there is illustrated a transformer 30 with a tank 31 having a front panel 32 for the attachment of electrical cable, not shown. The transformer tank 31 includes a pair of metal sidewalls 33, 34 and a metal top panel 35. As may be seen in FIGS. 3 and 4 in the tank 31, there are no knife-edges extending from the sidewalls and top panel of the tank as disclosed in the embodiment illustrated in FIGS. 1 and 2. The enclosure 36 illustrated in FIG. 3 is similar to enclosure 16 in FIG. 1 and is made of non-conductive, flame resistant material for cooperation with the front panel 32 to provide an enclosed cable compartment for the tank 31. To enable the non-conductive closure 36 to be mounted on the transformer tank 31 there is provided a cabinet interface 40 of non-conductive, flame resistant material mounted on the periphery of the front panel 32. The interface 40 is constructed and arranged to mate with the enclosure 36 to provide a seal between the front panel 32 of the tank 31 and the enclosure 40 for the cable compartment. As may be seen in FIG. 4 the cabinet interface 40 is made of non-conductive flame resistant material having a bifurcated edge including sections 41 and 42 for mounting the interface 40 on the periphery of the front panel 32 and a non-bifurcated edge 43 arranged to mate with the periphery of the enclosure 36 to provide a seal between the front panel 32 of the tank 11 and the enclosure 36 for the cable compartment. The interface 40 has a Y-shaped cross-section, with the upper portion of the Y including sections 41 and 42 engaging the periphery of the front panel 32 and the lower portion 43 of the Y mating with the periphery in the form of the groove 37 of the enclosure 36. The cabinet interface 40 is adapted to be detachably secured to the periphery of the front panel 32 of the transformer tank as by adhesive 44. If desired, section 42 of the cabinet interface may be detachably secured to the sidewall 33 of the transformer tank 31. Other mechanical means may be used for securing the cabinet interface to the transformer tank if desired, however, adhesive is preferred since it is non-corrosive and less expensive.

While a preferred form of the invention has been described and illustrated, it is to be understood that other modifications may be made within the scope of the claims.

What is claimed is:

1. A transformer tank with detachable cabinet interface comprising:

a transformer tank having a metal front panel for attachment of an electrical cable, a pair of metal side walls connected to the opposite ends of said front panel and a metal top panel connected to the upper edge of said front panel and interconnecting said pair of side walls, a one-piece enclosure of non-conductive, flame resistant material for cooperation with said front panel to provide an enclosed cable compartment for said tank, and a cabinet interface of non-conductive, flame resistant material mounted on the periphery of said front panel, said interface being constructed and arranged to mate with said enclosure to provide a seal between the front panel of said tank and said enclosure for the cable compartment; said interface comprising strip material having a tongue and groove, with the groove engaging the periphery of said front panel and the tongue mating with the periphery of said enclosure.

2. A transformer tank according to claim 1, wherein said interface strip material is secured to the periphery of said front panel.

3. A transformer tank according to claim 1, wherein said interface strip material is detachably secured to the periphery of said front panel.

4. In a transformer having a transformer tank with a metal front panel for attachment of an electrical cable, a pair of metal side walls connected to the opposite ends of the front panel and a metal top panel connected to the upper edges of the front panel and interconnecting the pair of side walls, a one-piece enclosure of non-conductive, flame resistant material for cooperation with the front panel to provide an enclosed cable compartment for the tank, the improvement of a cabinet interface of non-conductive, flame resistant material having a bifurcated edge for mounting the interface on the periphery of the front panel and a non-bifurcated edge arranged to mate with the periphery of the enclosure to provide a seal between the front panel of the tank and the enclosure for the cable compartment.

5. A transformer with detachable cabinet interface comprising:

a transformer tank having a metal front panel for attachment of an electrical cable, a pair of metal side walls connected to the opposite ends of said front panel and a metal top panel connected to the upper edge of said front panel and interconnecting said pair of side walls, a one-piece enclosure of non-conductive, flame resistant material for cooperation with said front panel to provide an enclosed cable compartment for said tank, and a cabinet interface of non-conductive, flame resistant material mounted on the periphery of said front panel, said interface being constructed and arranged to mate with said enclosure to provide a seal between the front panel of said tank and said enclosure for the cable compartment;

said interface comprising strip material having a Y-shape, with the upper portion of the Y engaging the periphery of said front panel and the lower portion of the Y mating with the periphery of said enclosure.

* * * * *